(12) United States Patent
Fjelstad

(10) Patent No.: US 7,095,054 B2
(45) Date of Patent: Aug. 22, 2006

(54) SEMICONDUCTOR PACKAGE HAVING LIGHT SENSITIVE CHIPS

(75) Inventor: Joseph Fjelstad, Maple Valley, WA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/948,898

(22) Filed: Sep. 24, 2004

(65) Prior Publication Data

US 2005/0035357 A1  Feb. 17, 2005

Related U.S. Application Data

(63) Continuation of application No. 10/342,973, filed on Jan. 15, 2003, now Pat. No. 6,888,168, which is a continuation of application No. 09/025,558, filed on Feb. 18, 1998, now Pat. No. 6,583,444.

(60) Provisional application No. 60/038,214, filed on Feb. 18, 1997.

(51) Int. Cl.
*H01L 31/12* (2006.01)

(52) U.S. Cl. .................. 257/82; 257/98; 257/433; 257/787

(58) Field of Classification Search .................. None
See application file for complete search history.

(56) References Cited

U.S. PATENT DOCUMENTS

| 3,764,862 | A | 10/1973 | Jankowski |
| 4,040,078 | A | 8/1977 | Ecton, Jr. et al. |
| 4,530,152 | A | 7/1985 | Roche et al. |
| 4,566,184 | A | 1/1986 | Higgins et al. |
| 4,890,383 | A | 1/1990 | Lumbard et al. |
| 5,079,190 | A | 1/1992 | Mihara |
| 5,122,860 | A | 6/1992 | Kikuchi et al. |
| 5,148,265 | A | 9/1992 | Khandros et al. |
| 5,148,266 | A | 9/1992 | Khandros et al. |
| 5,200,362 | A | 4/1993 | Lin et al. |
| 5,273,938 | A | 12/1993 | Lin et al. |
| 5,298,768 | A | 3/1994 | Okazaki et al. |
| 5,355,016 | A | 10/1994 | Swirbel et al. |
| 5,367,766 | A | 11/1994 | Burns et al. |
| 5,418,186 | A | 5/1995 | Park et al. |
| 5,436,203 | A | 7/1995 | Lin |
| 5,468,999 | A | 11/1995 | Lin et al. |
| 5,474,958 | A | 12/1995 | Djennas et al. |
| 5,487,999 | A | 1/1996 | Farnworth |
| 5,557,150 | A | 9/1996 | Variot et al. |
| 5,851,847 | A | 12/1998 | Yamanaka |
| 5,900,676 | A | 5/1999 | Kweon et al. |
| 5,976,912 | A | 11/1999 | Fukutomi et al. |
| 6,001,671 | A | 12/1999 | Fjelstad |

(Continued)

FOREIGN PATENT DOCUMENTS

EP  751561 A1  1/1997

(Continued)

*Primary Examiner*—Alonzo Chambliss
(74) *Attorney, Agent, or Firm*—Lerner, David, Littenberg, Krumholz & Mentlik, LLP

(57) ABSTRACT

A microelectronic package includes a light sensitive microelectronic element having a front face including one or more contacts and a rear surface, and conductive leads having first ends connected to the one or more contacts and second ends connected to one or more conductive pads adjacent the light sensitive microelectronic element. The package also includes an at least partially transparent encapsulant covering the light sensitive microelectronic element, the conductive leads and the one or more conductive pads, whereby the one or more conductive pads are exposed on a surface of the encapsulant.

16 Claims, 11 Drawing Sheets

U.S. PATENT DOCUMENTS

| | | |
|---|---|---|
| 6,060,729 A | 5/2000 | Suzuki et al. |
| 6,531,328 B1 | 3/2003 | Chen |
| 6,583,444 B1 | 6/2003 | Fjelstad |
| 6,888,168 B1 * | 5/2005 | Fjelstad ..................... 257/81 |

FOREIGN PATENT DOCUMENTS

| | | |
|---|---|---|
| JP | 54-71986 | 8/1979 |
| JP | 63-283136 | 11/1988 |
| JP | 1-270282 | 10/1989 |
| JP | 03-94430 | 4/1991 |
| JP | 03-94431 | 4/1991 |
| JP | 03094459 | 4/1991 |
| JP | 04137570 A1 | 5/1992 |
| JP | 7-15046 | 1/1995 |
| JP | 07064208 A1 | 3/1995 |
| JP | 8-241974 | 9/1996 |

* cited by examiner

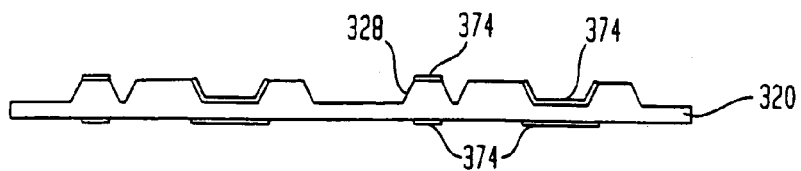
FIG. 7G
FIG. 7H
FIG. 7H'
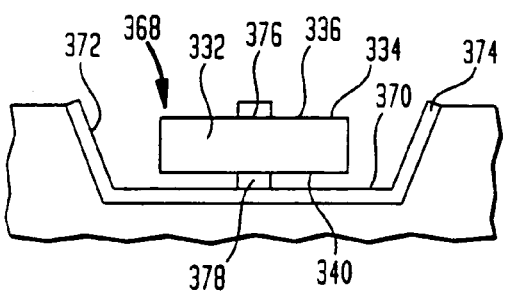
FIG. 7I
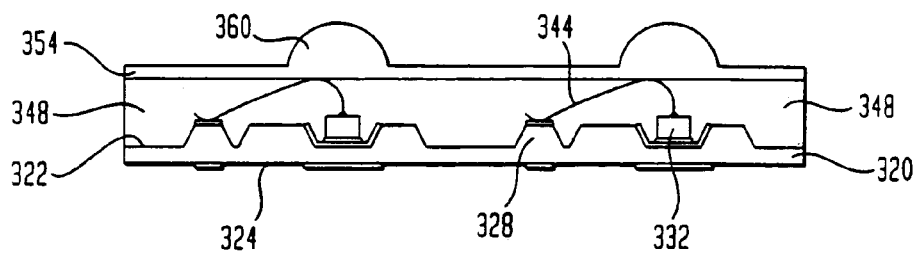
FIG. 7J
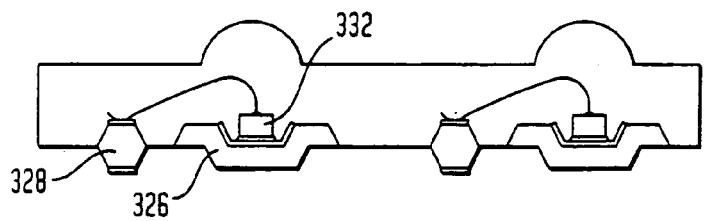
FIG. 7K
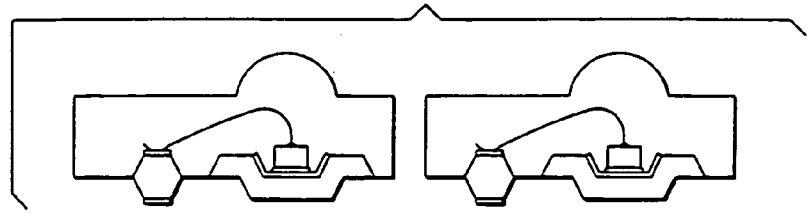

SEMICONDUCTOR PACKAGE HAVING LIGHT SENSITIVE CHIPS

CROSS REFERENCE TO RELATED APPLICATIONS

The present application is a continuation of U.S. patent application Ser. No. 10/342,973 filed Jan. 15, 2003 now U.S. Pat. No. 6,888,168, which is a continuation of U.S. patent application Ser. No. 09/025,558 filed Feb. 18, 1998 now U.S. Pat. No. 6,583,444, which claims benefit of U.S. Provisional Application No. 60/038,214, filed Feb. 18, 1997, and is related to U.S. patent application Ser. No. 08/634,464 filed Apr. 18, 1996, the disclosures of which are hereby incorporated by reference herein.

BACKGROUND OF THE INVENTION

The present invention generally relates to microelectronic assemblies, and more specifically it relates to semiconductor chip packages having light sensitive or light emitting chips.

The semiconductor chip packaging industry is a highly competitive business in which the packaging companies are waging an on-going battle to improve the reliability and cost of packaged chips. Moreover, the electronics industry continues to demand that chip packages take up less space within electronic components. As such, it is desirable that the overall size of the packaged chips be reduced so that the same circuitry fits into smaller areas thereby allowing for more portability (size, weight, etc.) for the resulting finished electronic product and/or allowing for an increase in a product's processing power without also increasing its size.

One type of semiconductor chip package includes packages which incorporate light sensitive semiconductor devices such as integrated circuits. When packaging such light sensitive devices (referred to herein as "IC's" or "chips"), it is necessary to allow for the passage of visible or near visible light, i.e. ultraviolet ("UV") or infrared ("IR") light, to the surface of the packaged chip. For example, ultraviolet-erasable programmable read-only memories ("UV EPROMS") have traditionally been manufactured using a standard lead frame type package, as shown in FIG. 1. Typically in this type of package, a cavity is molded (as by an injection molding operation) around a lead frame and the back surface of the chip is attached to a paddle on the lead frame. The chip contacts on the face surface of the chip are then wire bonded to respective leads on the lead frame. This allows the chip assembly to be enclosed on three sides. The fourth side of the assembly is then fitted with a transparent lid made of glass or quartz so that the chip is physically protected but still capable of receiving light through the lid.

In a similar fashion, when packaging certain light emitting chips such as light emitting diodes (LED's), it is desirable to allow for the passage of visible or near visible light from a surface of the packaged chip. When manufacturing light emitting diodes, the LED's are commonly created on leadframe like structures. As shown in FIG. 2, an electrically conductive back surface of the chip is typically attached to an electrically conductive base on a first lead and chip contacts on a face surface of the chip are wire bonded to corresponding second leads. The base of the first lead typically has a notch within which the chip sits. The assembly is then encapsulated by using an injection molding technique. The encapsulant may form a lens on the top of the LED package to aid in the focusing of the light being emitted from the chip.

U.S. Pat. No. 4,890,383 to Lumbard et al. discloses another technique for packaging LED's which use a supporting frame or substrate as part of the package structure. As set forth in the '383 patent, the substrate comprises an electrically insulating material such as synthetic plastic. The top surface of the substrate includes a conductive pattern which defines a land area and a connection pad. A light emitting diode is mounted on the land area so that its terminal underneath is electrically and mechanically connected to the land area. The upper side of the light emitting diode is provided with a terminal which is electrically conductive and connected with the connection pad via a bonding wire.

A second conductive pattern of highly conductive material such as copper is deposited onto the rear surface of the substrate. This second conductive pattern defines a first terminal pad and a second terminal pad. The land area on the top side of the substrate is provided with an extension which is electrically connected to the terminal pad on the under side via a plated through groove having a semicircular cross-section. Similarly, the connection pad on the upper side of the substrate is provided with an extension which is electrically connected to the terminal pad on the under side via a plated through groove, which is preferably identical to the plated through groove. In this manner the two terminal pads serve as external terminals for the light emitting diode which mechanically secures modular component during surface mounting of the component. The assembly is provided with a transparent covering for protective purposes. Thus the light emitting diode and its electrical contacts including the bonding wire are sealed and encapsulated in the covering. The covering is made from clear or diffused epoxy, which provides optical characteristics.

Despite these and other efforts in the art, still further improvements in interconnection technology would be desirable. The chip packages manufactured in accordance with the prior art methods described above typically consume greater areas on a printed circuit board or within an electronic component than might otherwise be required. In addition, these particular prior art embodiments are also relatively complex and expensive.

SUMMARY OF THE INVENTION

In one embodiment of the present invention, a method of making a microelectronic package having an optoelectronic element, such as a light sensitive or light emitting semiconductor chip, includes providing a sacrificial layer having a first surface and one or more conductive pad areas. One or more conductive pads and a base may be selectively formed on the first surface of the sacrificial layer, preferably by using photolithographic techniques. In certain embodiments, the base may include a conductive material, such as an electrically conductive material. The base and pads are preferably formed using electroplating techniques, whereby the base is located within a central region defined by the conductive pads. After the base and the one or more conductive pads have been formed, the optoelectronic element is provided. The optoelectronic element may have a front face including a plurality of contacts and an optical area for receiving incoming light and a rear surface. The rear surface of the optoelectronic element may then be juxtaposed and attached to the top surface of the base by preferably using an adhesive such as a thermally conductive adhesive. Next, the contacts may be electrically interconnected with the one or more conductive pads on the sacrificial layer using wire bonding techniques. In one preferred embodiment, the wire bonding step includes providing conductive wires having first and second ends, bonding the first ends of the wires to the contacts and bonding the second ends of the wires to the conductive pads. Other elements which may be used to interconnect the contacts and the conductive pads include electroformed beam leads and tape-automated bonding leads (TAB leads). Next, a curable and at least partially transparent encapsulant is provided over the first surface of the sacrificial layer so as to encapsulate the base, the optoelectronic element and the one or more conductive pads and the encapsulant is cured. As used herein, the term "at least partially transparent" means a material that allows any amount of light to pass therethrough and includes the terms light transmissive, transparent and/or translucent. In certain preferred embodiments this term means a material transparent to one or more desired wavelengths of light. For example, the material may be transparent to certain wavelengths of light and opaque to other wavelengths of light. After the curing step the sacrificial layer is at least partially removed so as to leave the base and the one or more conductive pads exposed and/or accessible at a bottom surface of the encapsulant. The bottom surface of the encapsulant preferably defines the bottom of the package. In certain preferred embodiments the base and the one or more conductive pads protrude slightly beyond the bottom surface of the encapsulant so that the package may be readily interconnected with an external circuit element such as a PCB. In other preferred embodiments, a base is not used to make the package and the rear surface of the optoelectronic element is attached directly to the first surface of the sacrificial layer during fabrication of the package so that after the sacrificial layer is removed the rear surface of the optoelectronic element is exposed and/or accessible at the bottom of the package. As such, the rear surface of the chip may be directly connected to an external element, such as a heat sink or a PCB. In still other embodiments, the base and/or the one or more conductive pads may be formed from the sacrificial layer.

The method described above may also include the step of placing a lid at a top surface of the encapsulant so that the lid overlies the front face of the optoelectronic element. The lid is preferably transparent or at least partially transparent and is preferably selected from the group consisting of glass, quartz and rigid polymeric materials. In certain preferred embodiments, the lid is formed separately from the package and is attached to the top surface of the encapsulant. In other embodiments the lid may be integrally formed with the top surface of the encapsulant. The lid may include a coating for filtering out certain frequencies of light. The lid may also include a lens for focusing incoming light onto the optical area on the front face of the optoelectronic element. The lens may be of any type, such as a Fresnel-type lens or a telescopic-type lens. In certain preferred embodiments, the top surface of the lid, which is remote from the front face of the optoelectronic element, is provided with a connector. The connector preferably secures an end of a light transmitting cable on the top surface of the lid so as to focus light from the light transmitting cable through the transparent lid and onto the optical area on the front face of the optoelectronic element. The connector may be integrally formed with the lid and may include a cavity for receiving and securing the end of the light transmitting cable.

In other preferred embodiments, a plurality of microelectronic packages may be manufactured simultaneously on the same sacrificial layer using the techniques described above. In these embodiments after the packages have been formed, individual packages are provided by severing the sacrificial layer to provide individual microelectronic packages. In other embodiments, the separating step provides a plurality of multichip modules whereby each module includes two or more of the optoelectronic elements.

In a further embodiment of the present invention, a method of making a microelectronic package includes the steps of providing an electrically conductive sheet and forming a conductive base having a cavity formed therein and at least one conductive pad adjacent the conductive base, the cavity having a light reflective surface. Portions of the conductive sheet may be removed using photolithographic and etching techniques. In other embodiments the conductive pads and conductive base may be formed using a die or stamping machine. The cavity is preferably a depression formed into the first surface of the electrically conductive sheet and may include a bottom portion and side walls extending therefrom. The bottom portion and the side walls of the cavity and the at least one conductive pad may be covered with a layer of a non-oxidizing electrically conductive material, such as silver or gold. Although both silver and gold may be used as effective electrically conductive layers, silver is more preferred because it is relatively more reflective than gold. In other embodiments, the electrically conductive material may also be provided over the second surface of the conductive sheet at locations in alignment with the conductive pad and the cavity. An optoelectronic element, such as a light emitting chip or light emitting diode (LED), having a front face including at least one contact and a rear surface having at least one contact is provided and the rear surface of the optoelectronic element is attached to the base so as to position the optoelectronic element in the cavity and electrically interconnect the optoelectronic element and the conductive base. Next, the at least one contact on the front face of the optoelectronic element may be electrically interconnected with the at least one conductive pad such as by using the wire bonding techniques described above. A curable and at least partially transparent or translucent encapsulant may then be provided over the first surface of the conductive sheet so as to encapsulate the at least one conductive pad, the conductive base and the optoelectronic element. The encapsulant is then cured. In preferred embodiments the encapsulant can be cured by using heat, UV light, a two-part reacting mixture or curing at room temperature. After the curing step, additional portions of the conductive sheet may be selectively removed so as to electrically isolate the conductive base from the at least one conductive pad. The assembly may then be electrically interconnected with an external circuit element by connecting the conductive base and the at least one conductive pad to contacts on the external circuit element.

In certain preferred embodiments of the present invention the encapsulant has different levels of transparency or translucency. For example, in one particular preferred embodiment the encapsulant overlying the optical area of the optoelectronic element is more transparent than the encapsulant overlying the periphery thereof. The encapsulant may also include a compliant material whereby the gradient of compliancy varies throughout the package. In one particular embodiment the encapsulant adjacent the chip contacts is more compliant than the encapsulant adjacent the at least one conductive pads. This particular feature enables the conductive wires or leads adjacent the contacts to readily flex and move as the light sensitive chip or light emitting chip expands and contracts during operation. In still other preferred embodiments the encapsulant includes a color tinted portion for changing the color of the emitted light as perceived by an observer. For example, the light emitted from the optoelectronic element may be red and the encapsulant may have a blue tint so that the emitted light as perceived by an observer is purple.

Certain preferred embodiments of the present invention provide near "chip size" microelectronic packages having light sensitive or light emitting chips whereby the overall size of the package is not much larger than the size of the chip itself. Thus, the final packages have a smaller footprint and will take up less space on a circuit board or within an electronic component which enables the overall size of the final electronic product to be reduced. This is a dramatic advance over prior art packages which teach using bulky substrates which generally dwarf the size of the chip so as to create packages which are much larger than the chip being packaged, thereby wasting a significant amount of space within an electronic device. The present invention also provides methods for mass producing reliable and economical chip packages.

In yet another embodiment of the present invention, a method of making a multichip module having a plurality of optoelectronic elements includes the steps of providing a substrate having a dielectric layer disposed between a top conductive layer and a bottom conductive layer and selectively removing portions of the bottom conductive layer to form an array of conductive pads. Portions of the top conductive layer and the dielectric layer are then selectively removed to form an array of openings extending through the top conductive layer and the dielectric layer, whereby the array of openings are in alignment with the conductive pads. A plurality of optoelectronic elements, such as light emitting semiconductor chips, are then provided over the top conductive layer and electrically interconnected with the top conductive layer. Each optoelectronic element preferably includes a front face having a contact and a rear surface having a contact, whereby the rear surface of each optoelectronic element is preferably attached to the top conductive layer. The rear surfaces may be attached by applying an electrically conductive adhesive over the top conductive layer and abutting the rear surfaces of the optoelectronic elements against the electrically conductive adhesive. Each optoelectronic element may also be electrically interconnected with one of the conductive pads such as by using flexible conductive leads or wires to interconnect the contacts on the front face of the optoelectronic elements and the conductive pads. A curable and at least partially transparent encapsulant is then provided over the top conductive layer and the plurality of optoelectronic elements and the encapsulant is cured. A transparent lid which overlies the optoelectronic elements may be attached over a top surface of the encapsulant layer.

The foregoing and other objects, features and advantages of the present invention will be more readily apparent from the detailed description of the preferred embodiments set forth below, taken in conjunction with the accompanying drawings.

BRIEF DESCRIPTION OF THE DRAWINGS

FIGS. 7A–7K show a side view of another method of manufacturing a microelectronic package including an optoelectronic element according to yet another embodiment of the present invention.

FIG. 7H' shows a microelectronic package including an optoelectronic element according to another preferred embodiment of the present invention.

DETAILED DESCRIPTION

Figure 1:
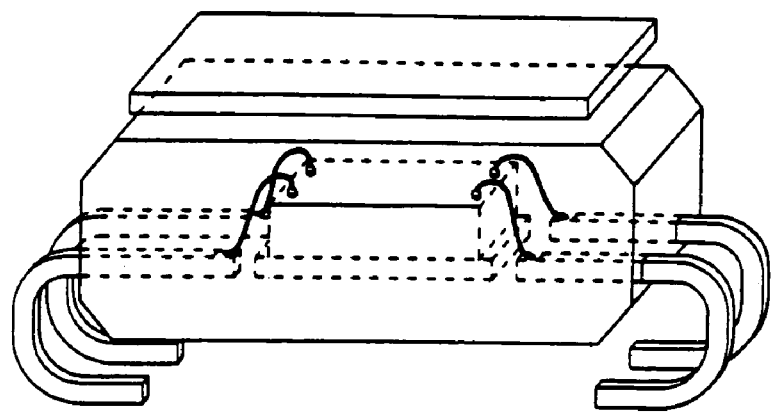
FIG. 1 shows a side view of a prior art chip package including a light sensitive chip.
Figure 2:
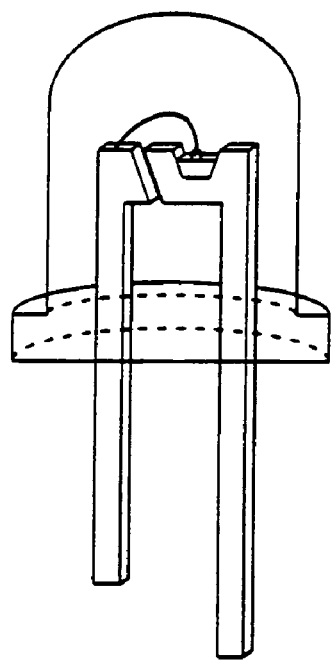
FIG. 2 shows a side view of a prior art chip package including a light emitting chip.
Figure 3A:
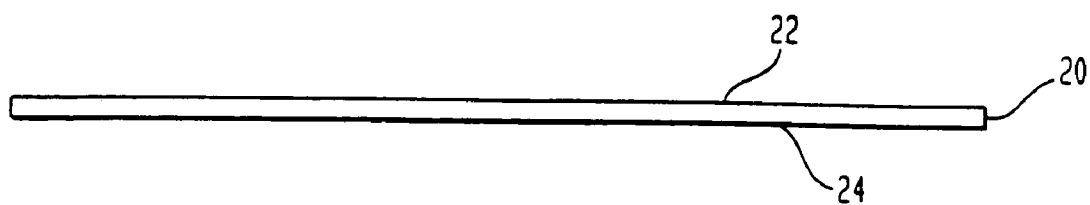
FIGS. 3A–3I show a side view of a method of making a microelectronic package including one or more optoelectronic elements according to one embodiment of the present invention.
Figure 3B:
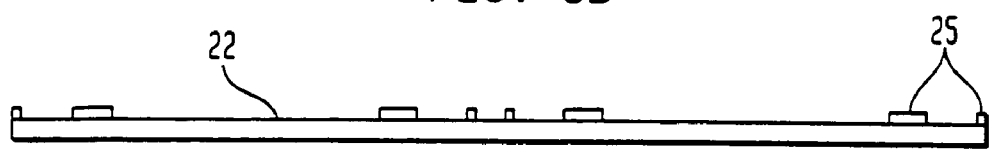
Figure 3C:
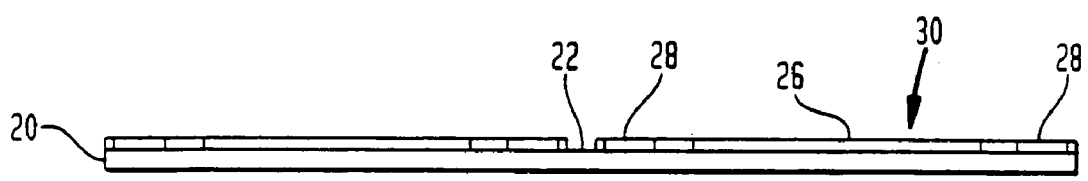
Figure 3D:

FIGS. 3A through 3I show a method for making a package having a semiconductor chip such as a light sensitive chip, according to one preferred embodiment of the present invention. The method described is somewhat similar to the process disclosed in U.S. patent application Ser. No. 08/634,464, filed on Apr. 18, 1996, the disclosure of which is hereby incorporated by reference herein. As shown in FIG. 3A, a sacrificial layer 20 is provided having a first surface 22 and a second surface 24. The sacrificial layer 20 may include a conductive metallic material, a polymer material or a combination of both. Specific examples of preferred sacrificial layer materials include aluminum, copper, steel, iron, bronze, brass, polyimide, polyetherimide, flouropolymer and alloys and combinations thereof. In the particular embodiment shown in FIG. 3A, the sacrificial layer 20 includes a sheet of aluminum having an approximate substantially uniform thickness of about 100-200 microns; although, the sacrificial sheet could be thicker or thinner in some embodiments. Referring to FIG. 3B, photolithographic techniques are used to define a pattern over the first surface 22 of the sacrificial layer 20. Preferably a photo-resist layer 25 is formed over the first surface 22 of the sacrificial layer 20 and apertures are developed and removed using photolithographic techniques. Referring to FIG. 3C, next a base 26 and a plurality of conductive pads 28 are deposited or electroplated within the apertures in the photo-resist layer 25 on the first surface 22 of the sacrificial layer 20. The particular embodiment shown in FIG. 3C shows two such bases 26 with each base 26 surrounded by two or more conductive pads 28. The conductive pads 28 generally define a central region 30 therebetween and the base 26 is formed in the central region 30. Referring to FIGS. 3C and 3D, the remainder of the photo-resist layer 25 is removed from the first surface 22 of the sacrificial layer 20 to leave behind one or more bases 26 whereby each base 26 is surrounded by conductive pads 28 associated therewith.

Figure 3E:
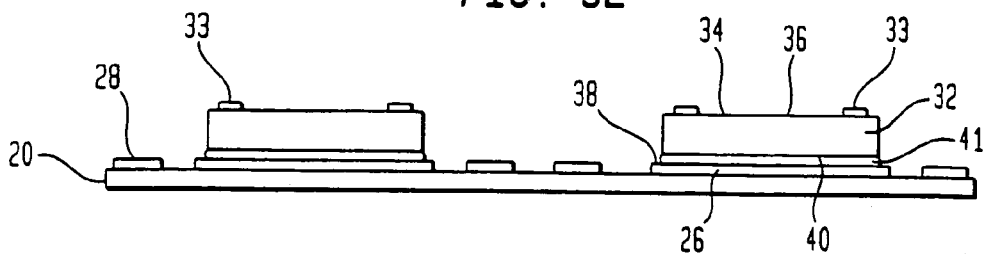
Figure 3F:
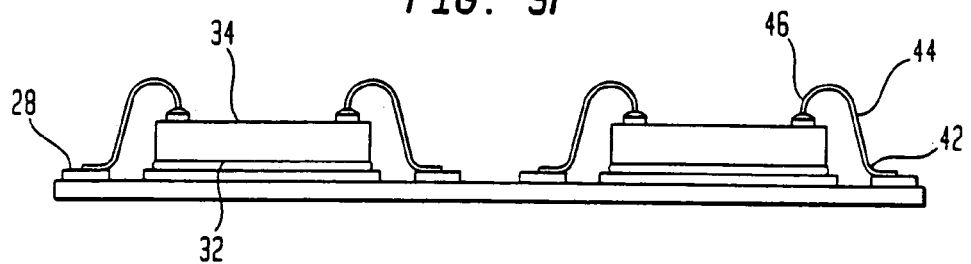

Referring to FIG. 3E, an optoelectronic element such as a light sensitive integrated circuit 32 having a front face 34 including an optical area 36 for receiving light is then juxtaposed with a top surface 38 of the base 26. Each light sensitive chip 32 preferably includes a plurality of contacts 33 on the front face 34 and a rear surface 40. The rear surface 40 of the chip 32 is preferably attached to the top surface 38 of the base 26 using a thermally conductive adhesive material 41, typically comprised of metal loaded thermoset or thermoplastic materials. Referring to FIG. 3F, the contacts 33 on the front face 34 of the chip 32 are then electrically connected to their respective conductive pads 28, typically using a standard wire-bonding operation. In FIG. 3F, the electrical connections are made by using a wirebonder to stitch bond first ends 42 of a flexible, conductive wire 44 to the conductive pads 28 and second ends 46 of the wire 44 to the chip contacts 33. The stitch bonds create a low profile electrical connection between the contacts 33 and the conductive pads 28 which, inter alia, results in the final package being thinner. The wirebonded connection may take the form of a ball bond/stitch (or wedge) bond combination, as shown in FIG. 3F. Other elements which may be used to interconnect the chip contacts 33 and the conductive pads 28, include TAB leads and electroformed beam leads.

Figure 3G:
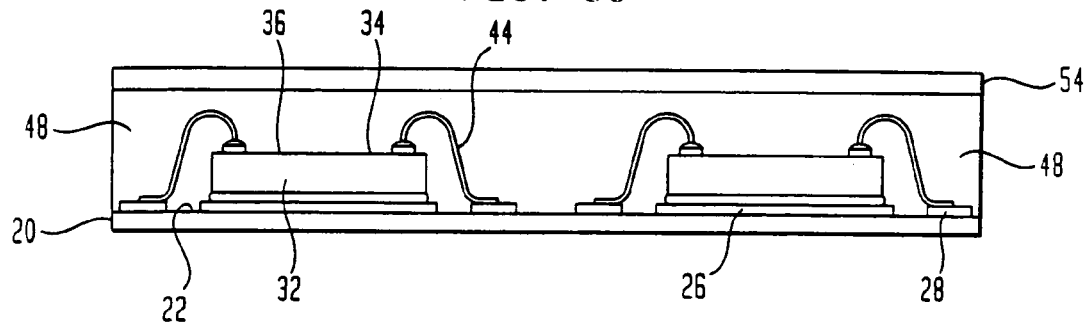

Referring to FIG. 3G, the entire assembly is then encapsulated using a flowable, curable encapsulant 48, such as by using an injection molding operation. The encapsulant 48 preferably covers the top surface 22 of the sacrificial layer 20 and encapsulates the optoelectronic element 32, the base 26, the conductive pads 28 and the wires 44. The curable encapsulant 48 typically includes filled or unfilled standard thermoset or thermoplastic resins as used in industry, such as epoxy resin, silicone resin or other plastic encapsulating material. The encapsulant 48 is then cured so as to provide structural integrity to the chip package as well as providing the boundaries of the package. The encapsulant 48 is preferably transparent or at least partially transparent so that light may pass through the encapsulant 48 and be received within the optical area 36 on the front face 34 of the optoelectronic element 32. However, in other embodiments the encapsulant 48 may be fairly opaque depending upon the amount or wavelength of light needed to reach the chip 32. In certain embodiments the level of transparency of the encapsulant 48 may change throughout the package so that the encapsulant 48 in one portion of the package is more or less transparent than the encapsulant 48 in another portion of the package. For example, the encapsulant 48 overlying the optical area 36 of the optoelectronic element 32 may be more transparent than the encapsulant 48 overlying peripheral portions of the chip 32. As mentioned above, the term "at least partially transparent" means a material that allows any amount of light to pass therethrough and includes the terms light transmissive, transparent and/or translucent. The terminology "at least partially transparent" may also be defined as a material which is transparent to one or more desired wavelengths of light (e.g. UV or IR light). For example, the material may be transparent to certain wavelengths of light and opaque to other wavelengths of light so that only desired wavelengths of light may pass through the material to the optoelectronic element.

The encapsulant 48 also preferably includes a compliant material, such as a silicone elastomer so that the conductive wires 44 may flex and bend during operation of the package. This will enhance the ability of the flexible wires 44 or leads to remain electrically connected to the contacts 33 and conductive pads 28 during expansion and contraction of the package elements. In some embodiments, it may be preferable to vary the level of compliancy of the encapsulant 48 throughout package so that certain portions of the wire 44 flex more easily than other portions of the wire 44. For example, referring to FIG. 3H, the encapsulant 48 may be more rigid near the bottom 50 of the package where the first ends 42 of the wires 44 are attached to the conductive pads 28 and relatively more compliant near the top 52 of the package where the second ends 46 of the wires 44 are attached to the chip contacts 33 so that the wires 44 may readily flex and bend during expansion and contraction of the chip 32. In still other preferred embodiments the encapsulant 48 may include a color tinted portion for changing the color of the light generated by the chip as perceived by an observer.

Referring back to FIG. 3G, after the optoelectronic element 32 has been electrically connected to the conductive pads 26, a lid 54 may be placed at a top surface 52 of the package assembly. Preferably the lid 54 is juxtaposed with the front face 34 of the chip 32. The lid 54 is then attached to the top surface 52 of the encapsulant 48 which also happens to be the top of the package. The lid 54 is preferably transparent and may be made of any suitable transparent material, such as glass, quartz, and rigid polymeric materials. The lid 54 may also be made using a molding operation as opposed to attaching a separately formed lid. The lid 54 may be integrally molded simultaneously with the encapsulant 48 so that the lid 54 has special surface features. In this latter embodiment, the lid 54 may be juxtaposed with the chip 32 and the curable liquid encapsulant may be introduced between the lid 54 and the chip 32. In certain embodiments, the lid 54 may include a coating applied to the surface thereof for filtering certain frequencies of light. In other preferred embodiments, light reflective or light focusing elements such as transparent beads or spheres may be used in place of a lid. The transparent beads or spheres, which may comprise plastic or glass, are preferably provided in the encapsulant, preferably before the encapsulant is cured, so that one or more of the light focusing elements are aligned with one or more optoelectronic elements. The beads or spheres may have different light reflective properties. As mentioned above, the beads or spheres typically replace the lids described above and their use will generally result in a significant cost savings.

Figure 3H:
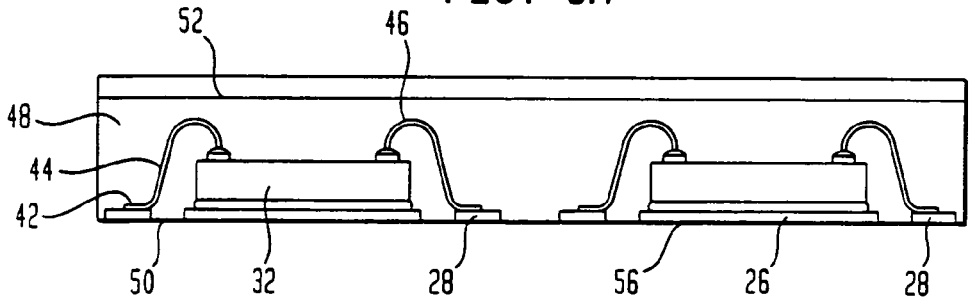

Referring to FIG. 3H, the sacrificial layer 20 is next removed, preferably using an etching operation to expose the conductive pads 28 and the base 26 at the bottom surface 50 of the encapsulant 48, which also happens to be the bottom of the package. If desired, the sacrificial layer may be selectively removed to provide added features on the bottom of the finished package, such as taller conductive pads 28 which protrude from the encapsulant 48 at the bottom of the package, and/or a heat sink (not shown) disposed beneath and protruding from the bottom 50 of the package and connected to the bottom surface 56 of the base 26.

Figure 3I:
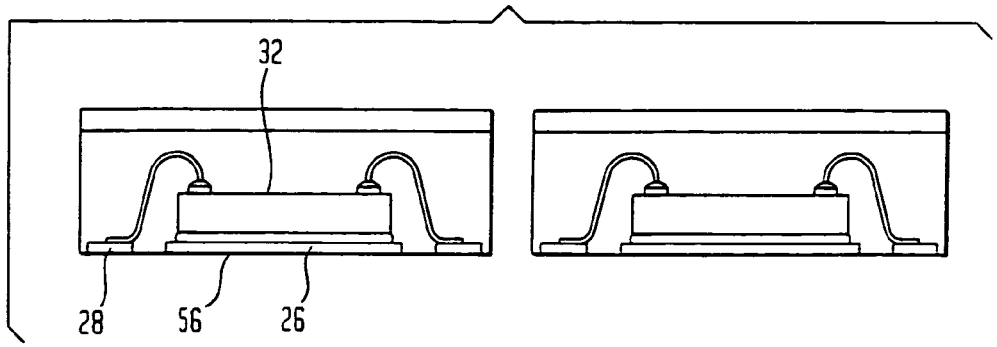

Referring to FIG. 3I, after the sacrificial layer 20 has been removed, the assembly may then be separated into individual packages having one optoelectronic element or into multichip modules having two or more optoelectronic elements. At this point, the exposed conductive pads 28 may be attached to respective bond pads on an external circuit element (not shown), such as a printed circuit board, using conventional solder balls. The solder balls preferably comprise a combination of tin and lead and may further include a conductive or non-conductive core. Typically, the bottom surface 56 of the base 26 is connected to the printed circuit board in such a way that heat is drawn away from the chip 32 and into the printed circuit board during operation of the package. The multichip package embodiment may include chips of different sizes which perform different functions.

Figure 4A:
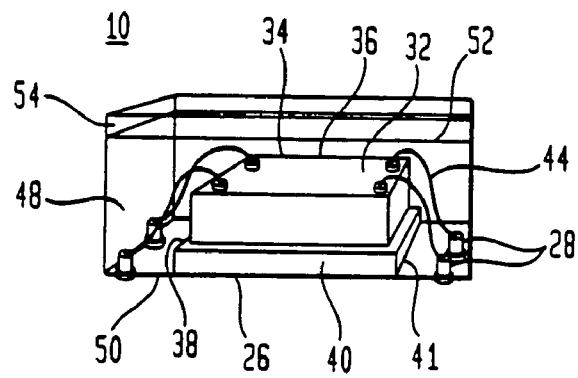
FIG. 4A shows a perspective side view of a microelectronic package including an optoelectronic element made in accordance with the method shown in FIGS. 3A–3I.

FIG. 4A shows a perspective side view of one preferred embodiment of a package 10 including an optoelectronic element, such as a light sensitive chip 32, which has been manufactured using the techniques described immediately above. The package 10 includes a base 26 having a top surface 38 whereby a rear surface 40 of the light sensitive chip 32 is attached to the top surface 38 of the base 26 by a thermally conductive adhesive 41. The chip 32 includes a front face having a plurality of contacts (not shown) which are connected to electrically conductive pads 26 by flexible, conductive wires 44. An at least partially transparent or translucent encapsulant layer 48 is provided over the chip 32. The encapsulant 48 provides structural integrity to the package 10. The conductive pads 28 and the base 26 are accessible at a bottom surface 50 of the package 10 and at the bottom of the encapsulant 48. An at least partially transparent lid 54 is juxtaposed with the front face 34 of the chip 38 and attached to the top surface 52 of the encapsulant 48. The lid 54 enables light to pass therethrough, through the at least partially transparent encapsulant 48 and onto the optical area 36 on the front face 34 of the chip 32.

Figure 4B:
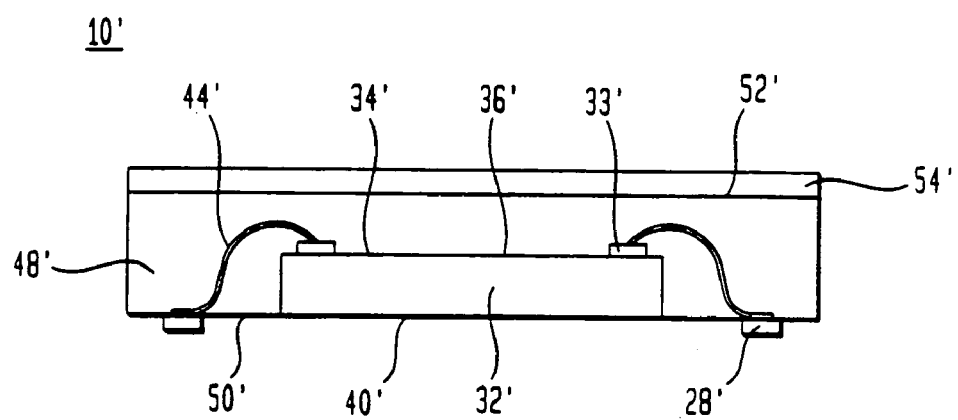
FIG. 4B shows a side view of another embodiment of a microelectronic package including an optoelectronic element made in accordance with the method shown in FIGS. 3A–3I.

FIG. 4B shows a side view of another preferred embodiment of a package 10' which has been manufactured using most of the techniques described above. However, in this particular embodiment, a base (as shown in FIG. 3C) is not provided over the first surface of the sacrificial layer before the optoelectronic element 32' is attached. The optoelectronic element 32' includes a front face 34' having contacts 33' and optical area 36'. Conductive wires 44' electrically interconnect contacts 33' and conductive pads 28'. An at least partially transparent lid 54' is attached to top surface 52' of encapsulant 48'. The rear surface 40' of the optoelectronic element 32' is secured directly to the first surface of the sacrificial layer and the remaining processing steps are followed as described above. In this particular embodiment, the one or more conductive pads 28' may be part of the sacrificial layer with the conductive pads being left behind when portions of the sacrificial layer are removed. After the sacrificial layer is removed, the rear surface 40' of the optoelectronic element 32' is exposed and accessible at the bottom 50' of the package 10' whereby the rear surface 40' may be attached directly to an external element such as a heat sink or a printed circuit board.

Figure 5:
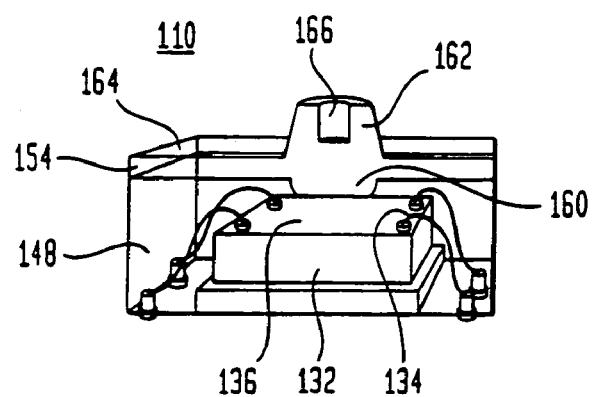
FIG. 5 shows a perspective side view of a microelectronic package including an optoelectronic element made using the method shown in FIGS. 3A–3I according to another embodiment of the present invention.

FIG. 5 shows another embodiment of the present invention including a package which is substantially similar to that shown in FIG. 4A. The package 110 includes encapsulant 148 and a lid 154 having a focusing lens 160 used to focus incoming light onto the optical area 136 on the front face 134 of the optoelectronic element 132. The lens 160 may be integrally formed with the lid 154 during the molding operation discussed above. The lens 160 preferably focuses the light transmitted to or from the optical area 136 of the chip 132. The lid 154 may also have a connector 162 accessible at the top surface 164 thereof for securing a fiber optic cable or other suitable light transmitting cable to the top of the lid 154. The connector 162 preferably has a cavity 166 formed therein so the light transmitting cable may be inserted into the cavity 162 so as to more accurately align the cable with the lens and with the optical area 136 of the chip 132. In further embodiments, the connector 162 may be formed using a molding operation so that the connector 162 is an integral portion of the lid.

Figure 6A:
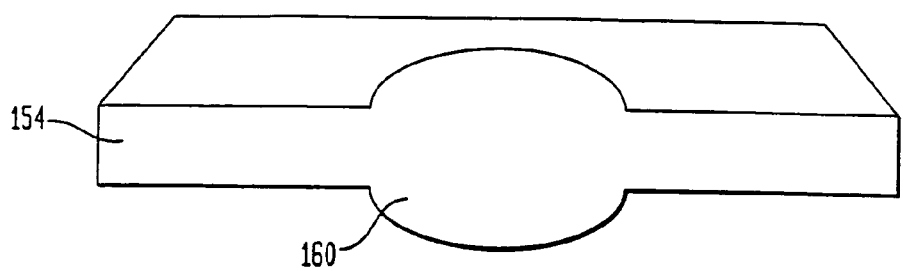
FIGS. 6A–6G show a side view of various lids including lenses which may be used with the microelectronic packages shown in FIGS. 3–5 according to various embodiments of the present invention.
Figure 6B:
Figure 6C:
Figure 6D:
Figure 6E:
Figure 6F:
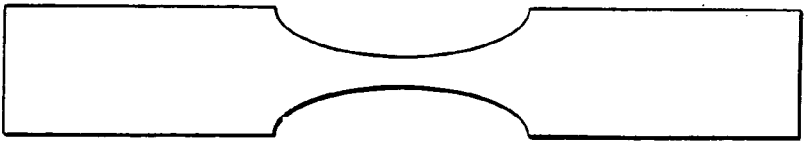
Figure 6G:
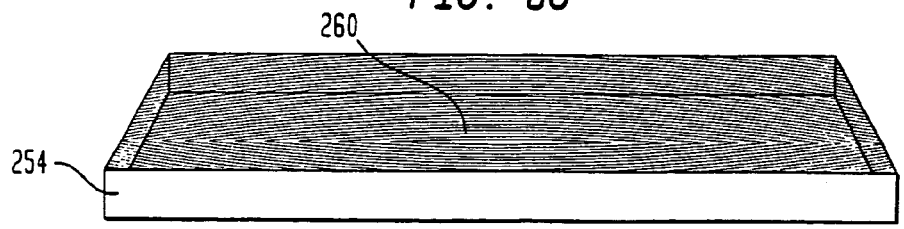

Referring to FIGS. 6A–6G, the lens 160 within the lid 154 may be of any structure that is beneficial to the particular light sensitive application. FIGS. 6A–6F show a variety of lenses that could be used in this chip package. FIG. 6G shows a lid 254 having a Fresnel type lens 260.

Figure 7A:
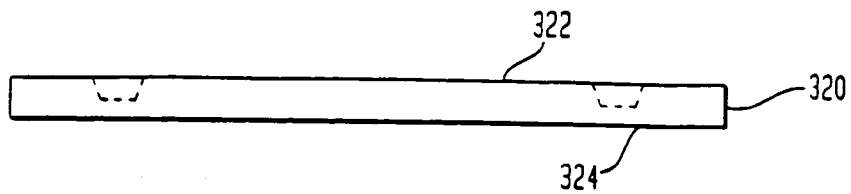
Figure 7B:
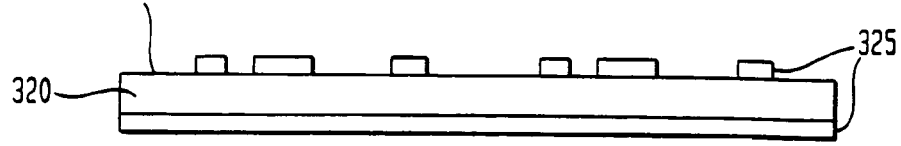
Figure 7C:
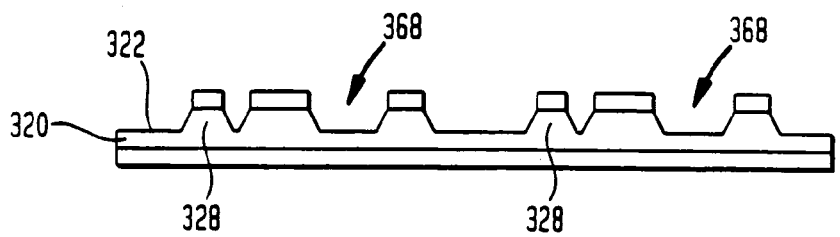
Figure 7D:
Figure 7E:
Figure 7F:
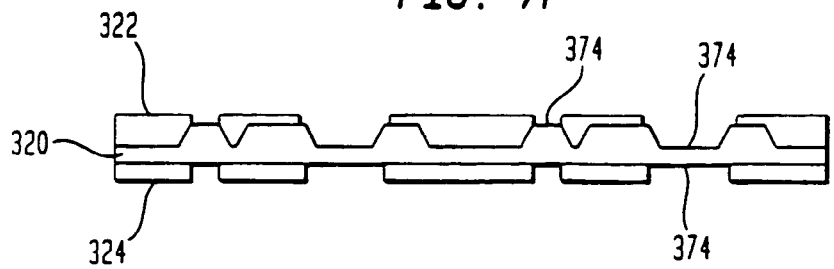

FIGS. 7A–7K show another embodiment of the present invention including a process for making microelectronic packages having one or more optoelectronic elements such as light sensitive (e.g. UV EPROM) or light emitting chips. The particular chip shown in FIGS. 7H through 7K is a light emitting diode (LED). Referring to FIG. 7A, an electrically conductive sheet 320 includes a conductive material such as copper. Referring to FIG. 7B, both the first and second surfaces 322 and 324 of the conductive sheet 320 are next coated with photoresist 325 which is exposed and developed using standard photolithographic techniques. Referring to FIG. 7B, certain portions of the photoresist 325 overlying the first surface 322 of the conductive sheet 320 are then removed to expose portions of the first surface 322 of the conductive sheet 320. Referring to FIG. 7C, the exposed first surface 322 of the conductive sheet 320 is then etched in a suitable etchant so that a desired amount of the conductive sheet 320 is removed to provide one or more cavities 368 surrounded by conductive pads 328. Referring to FIG. 7D, the photo-resist 325 is then removed from the first and second surface 322, 324 of the conductive sheet 320 leaving the conductive sheet 320 with the desired surface topology on the first surface 322 thereof. Referring to FIG. 7D, each cavity 368 preferably includes a bottom 370 and side walls 372. Referring to FIGS. 7E–7G, a non-oxidizing electrically conductive layer 374 may be selectively electroplated over the cavities 368 and the conductive pads 328 on the first surface 322 of the conductive sheet, as well as on the second surface 324 of the conductive sheet 320 at locations which are in alignment with the cavities 368 and the conductive pads 328. Typically, the non-oxidizing layers include conductive metal materials such as silver or gold. The electrically conductive layer 374 preferably enhances the reflection of light from the cavity 368.

As shown in FIG. 7H, one or more LED's 332 are then juxtaposed with the conductive layer 374 overlying each cavity 368. As shown in FIG. 7H' each LED chip 332 preferably has a front face 334 including a first contact 376 and a rear face 340 including a second contact 378. The rear surfaces of the LED chips 332 are then attached to the bottom 370 of their respective cavities 368 so as to position the optoelectronic elements in the cavity and so that the second contact 378 is electrically connected to the conductive layer 374. As shown in FIG. 7H', the cavity 368 is preferably deeper than the chip 332 is thick, thereby allowing the side walls 372 of the cavity 368 to help focus the light emitted from the optical area 336 on the front face 334 of the LED 332. The first contact 376 on the front face 334 of the chip is then electrically connected to its respective conductive pad 328, such as by using a wire-bonding technique, as shown in FIG. 7H.

Referring to FIG. 7I, a curable liquid encapsulant 348 is then provided over the first surface 322 of the conductive sheet 320 so as to cover the LED chip 332, the conductive pads 328 and the wires 344. The curable encapsulant 348 is preferably at least partially transparent or translucent and is similar to the encapsulant described above. The encapsulant 348 is then cured. A transparent lid 354 including a lens 360 may be applied in sheet form over the entire assembly or, as described above, may be integrally molded with the top of the package 310 using the encapsulant 348 and a suitable mold. Certain surface features, such as the lenses, may also be molded simultaneously with the injection molding step so that they are above the optical area 336 on the front face 334 of the chip 332. Referring to FIG. 7J, the bottom surface 324 of the conductive sheet 320 is then selectively etched to produce associated conductive base 326 and conductive pad 328 pairs which are electrically isolated from one another. Conductive layers 374 may be situated so as to act as an etch mask, depending on the material used for such conductive layers, to aid the selective etching process. The individually packaged LED chips 332 may then be separated from one another, as shown in FIG. 7K. Alternately, the packaged devices may be separated into multichip modules, whereby each module has two or more side-by-side LED's or light emitting chips.

Figure 8A:
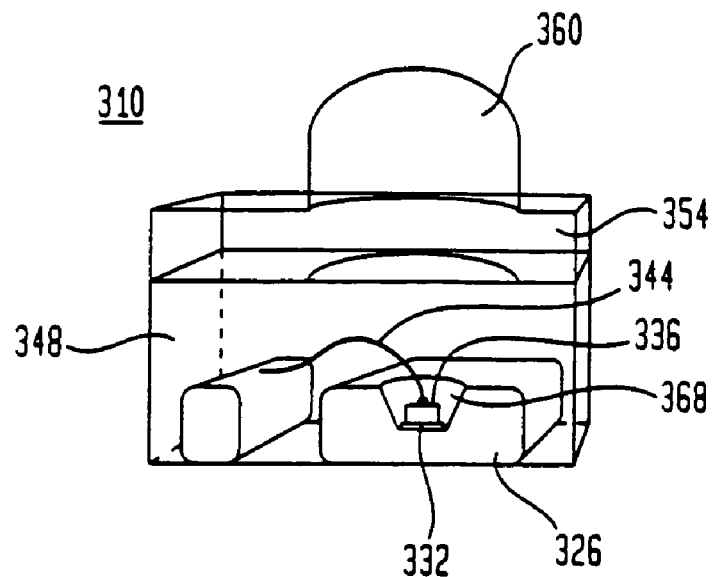
FIGS. 8A and 8B show respective perspective and cross-sectional side views of a microelectronic package including an optoelectronic element made in accordance with the method shown in FIGS. 7A–7K.
Figure 8B:
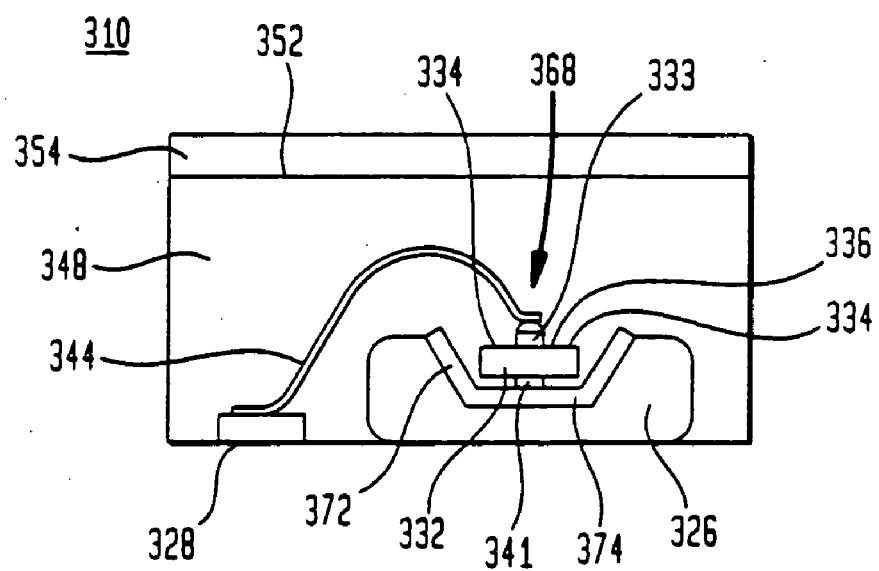

FIGS. 8A and 8B show a perspective view and a cross-sectional view, respectively, of one preferred embodiment of a package having a LED chip and made in accordance with the techniques described immediately above. The package 310 includes an electrically conductive base 326 having a cavity 368 within which a LED chip 332 is placed so that light generated by the chip 332 may be reflected by the side walls and bottom of the cavity 368 upwardly towards an opening of the cavity 368. The chip 332 is inset in the cavity 368 so that side walls 372 of the cavity 368, preferably coated with a metallic conductive layer 374, aid in reflecting light which is emitted from the chip. A first chip contact 333 located on the front face 334 of the chip 332 is electrically connected to a conductive pad 328 by a conductive wire 344. The rear surface 340 of the chip 332, having a second electrical contact 341, is electrically connected to the conductive base 326. The package 310 includes a cured encapsulant 348 which is substantially similar to that described above and which provides structural integrity to the chip package 310 as well as providing the boundaries of the package.

The package includes an at least partially transparent lid 354 juxtaposed with the front face 334 of the chip 332 and attached to the top surface 352 of the encapsulant 348. As shown in FIG. 8A, the lid 354 may include a lens 360 which helps to focus and/or intensify the light emitted from the chip 322; however, the shape of the lens may be of any structure that is beneficial to the particular application.

Assembly of the above described chip packages may be accomplished en mass as opposed to the one package at a time methods that are conventionally used today. Basically, the structures described above allow for many chips to be attached, bonded and encapsulated in sheet form (i.e. an array of many devices) and simultaneously cut into individual devices, parts or groups of devices thereby greatly improving manufacturing efficiency.

Figure 9A:
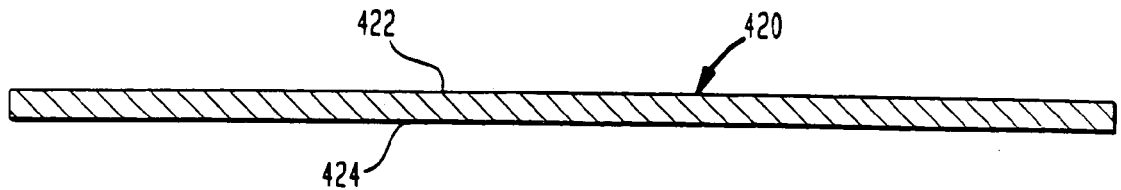
FIGS. 9A–9E show a side view of a method of making a microelectronic package including an optoelectronic element according to still further embodiments of the present invention.
Figure 9B:
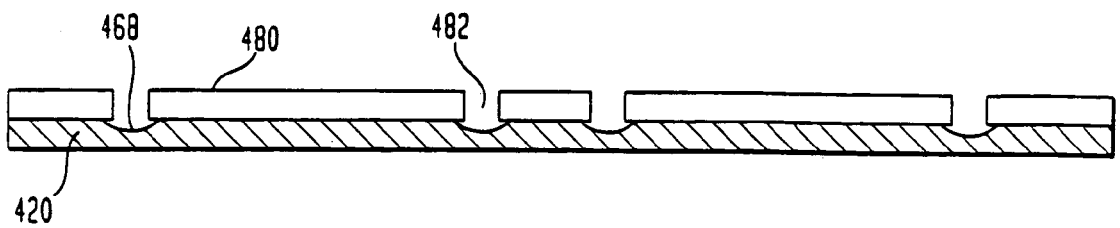

In a further alternative embodiment of the present invention shown by FIGS. 9A–9H, the conductive pads described above may have a more "rivet-like" shape. FIG. 9A shows a sacrificial layer 420, as earlier described, having a first surface 422 and a second surface 424. The sacrificial layer 420 is preferably an etchable layer so that cavities may be readily etched into the first surface 422 of the sacrificial layer 420. Referring to FIG. 9B, a photo-imageable dielectric layer 480, such as standard photoresist, is disposed over the first surface 422 of the sacrificial layer 420 and apertures 482 are developed and removed using standard photolithographic techniques so as to control the creation and placement of the cavities 468.

Figure 9C:
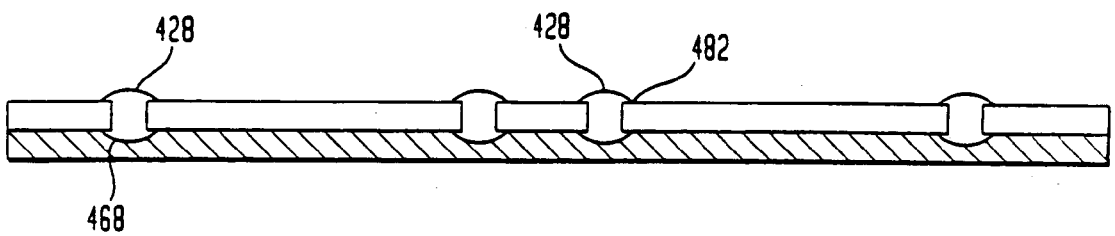
Figure 9D:
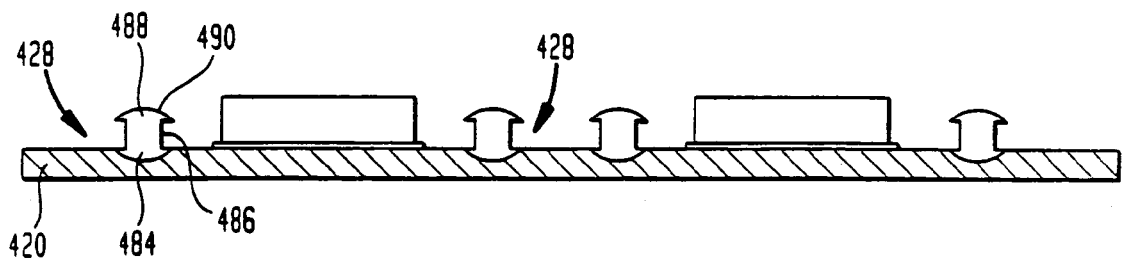
Figure 9E:
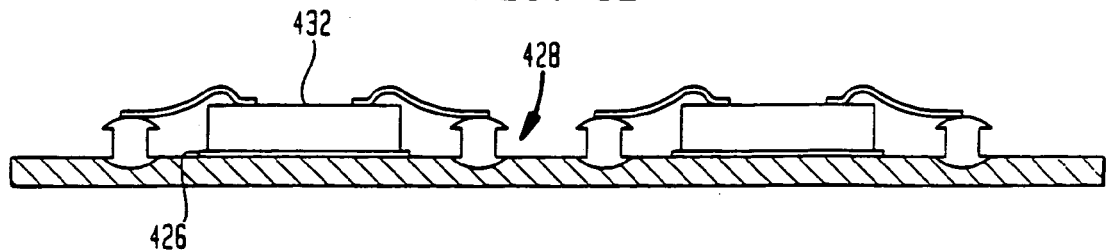

Referring to FIG. 9C, after the cavities 468 have been formed, conductive pads 428 are next plated into the cavities 468 and apertures 482 so as to create the "rivet-like" conductive pads 428. Referring to FIG. 9D, each pad 428 has a bottom bump flange 484 adjacent to the sacrificial layer 420 and integrally attached to a post 486 so that the post 486 protrudes from the bottom bump flange 484. A second top bump flange 488 is integrally attached to the opposite end of the post 486. Both bump flanges 484 and 488 have flange areas 490 which extend beyond the diameter of the post 486. Referring to FIG. 9E, the rear surface 440 of a light sensitive chip 432 is then attached to a base 426, electrically connected to the conductive posts 428 and encapsulated with the at least partially transparent encapsulant, using substantially the same techniques described above.

Figure 10:
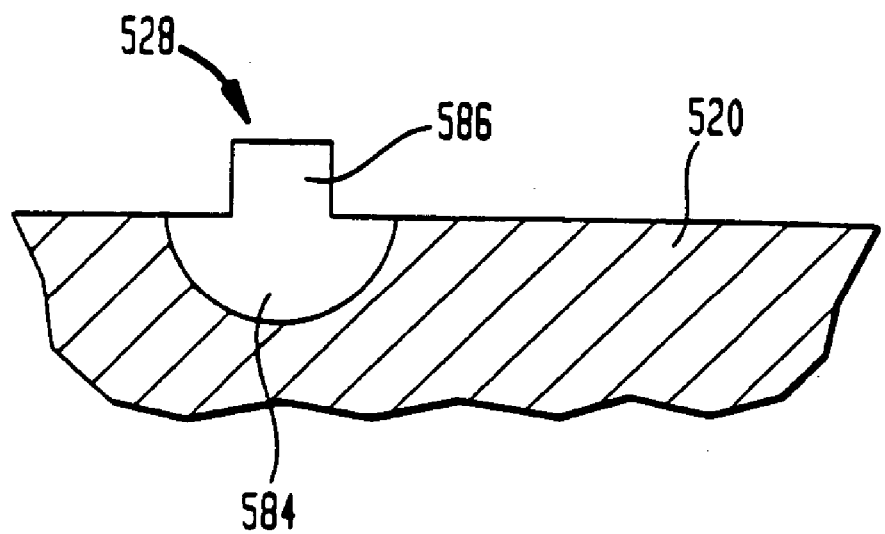
FIG. 10 shows a side view of another embodiment of a conductive pad structure shown in FIGS. 9A–9H according to another embodiment of the present invention.
Figure 11:
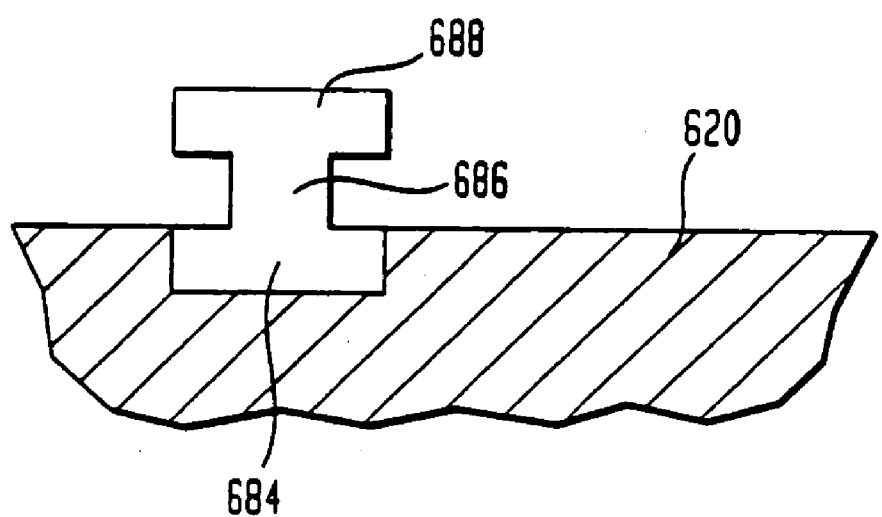
FIG. 11 shows a side view of still another embodiment of the conductive post structure shown in FIGS. 9A–9H according to another embodiment of the present invention.

FIGS. 10 and 11 show alternate cross-sectional side views of the conductive pads shown in FIGS. 9A–9E according to further embodiments of the present invention. In the embodiment shown in FIG. 10, the conductive pad 528 formed atop layer 520 includes a rounded bottom bump flange 584 and the post 586. In FIG. 11, a conductive pad including bottom bump flange 684, post 686 and top bump flange 688 are formed atop layer 620. The bottom and top bump flanges 684 and 688 are more squared off at the edges when compared to the rounded/oval bump flanges shown in FIG. 10. Bump flanges having other shapes may also be used.

Figure 12A:
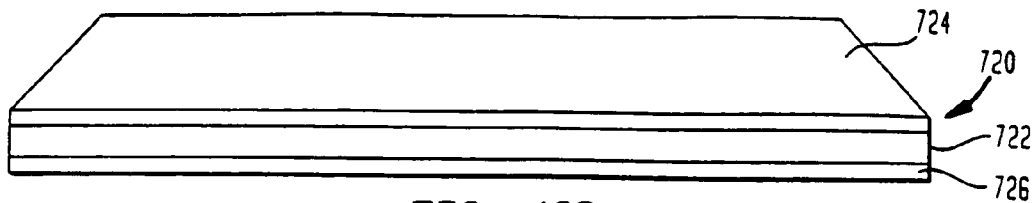
FIGS. 12A–12F show a side view of a method of making a multichip module including a plurality of optoelectronic elements according to still another embodiment of the present invention.
Figure 12B:
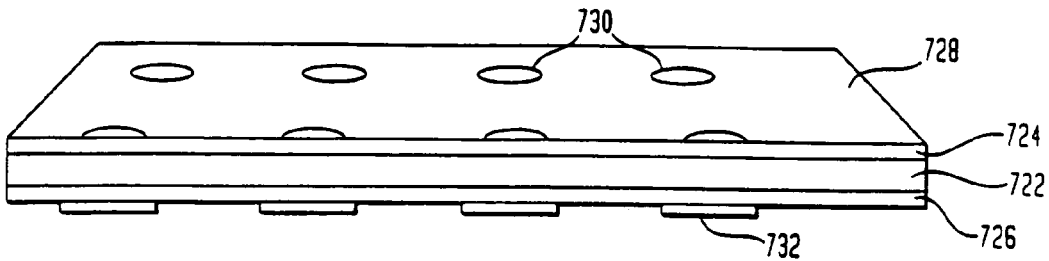
Figure 12C:
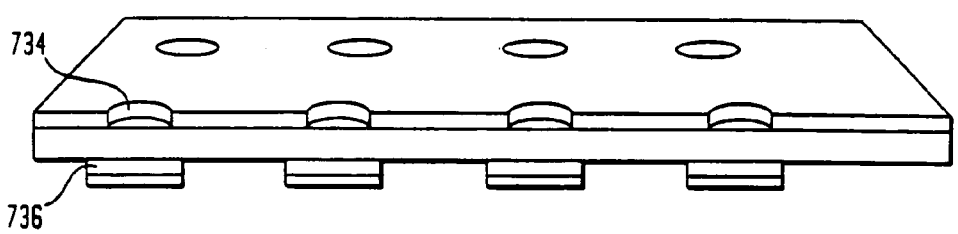
Figure 12D:
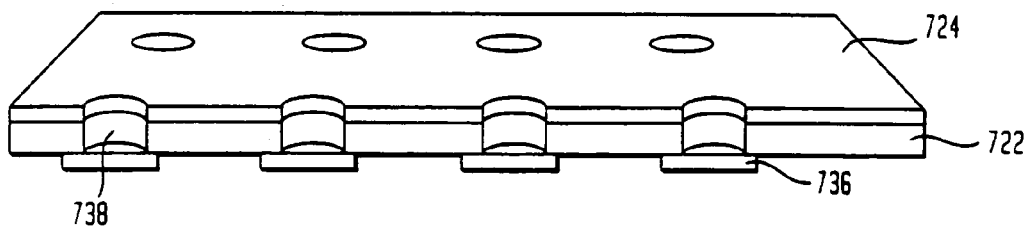

FIGS. 12A–12F show another embodiment of the present invention including a process for making a module 710 having a plurality of optoelectronic elements, such as the light emitting chips described above. Referring to FIG. 12A, a substrate 720 includes a dielectric layer 722, such as a polymeric layer, provided between a top conductive layer 724 and a bottom conductive layer 726. The top and bottom conductive layers 724 and 726 preferably include a highly conductive material such as copper. Referring to FIG. 12B, both the top and bottom conductive layers 724 and 726 are preferably coated with photoresist material which is exposed and developed using standard photolithographic techniques. Desirably, a first layer 728 of the photoresist material having an array of openings 730 therein is provided over the top conductive layer 724 and a second layer 732 of photoresist material, in the form of an array of pads, is provided over the bottom conductive layer 726. The array of pads 732 of photoresist material over the bottom conductive layer 726 are preferably in substantial alignment with the openings 730 in the first layer 728 of photoresist material. Referring to FIG. 7C, with the first layer 728 of photoresist material serving as a mask, portions of the top conductive layer 724 accessible through the openings 730 are etched away to provide partial vias 734 which extend to the dielectric layer 722. Similarly, the array of pads 732 of photoresist material over the bottom conductive layer 726 serve as a mask as portions of the bottom conductive layer 726 are etched away to provide an array of conductive pads overlying the bottom of the dielectric layer. Referring to FIG. 12D, the photoresist material is then stripped away and the dielectric material 722 accessible through the openings 730 in the top conductive layer 724 is etched away so that the conductive pads 736 are accessible through openings 738 extending from the top conductive layer 724.

Figure 12E:
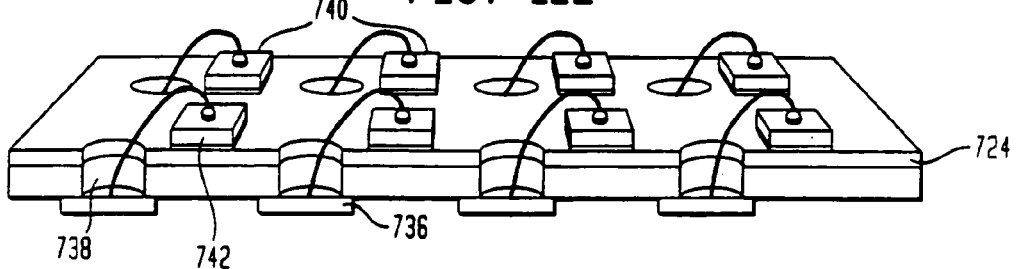

As shown in FIG. 12E, a plurality of LED's 740 are then juxtaposed with the top conductive layer 724, whereby each LED 740 is preferably positioned adjacent one of the openings 738 therein. Each LED chip preferably has a front face including a first contact and a rear surface including a second contact. The rear surfaces of the LED chips 740 are then assembled to the top conductive layer 724, preferably by using an electrically conductive adhesive 742, so that the LED chips 740 are electrically connected to the top conductive layer 724. The top conductive layer 724 will desirably serve as a common ground plane for all of the LED chips 740 which are electrically interconnected therewith. Each LED chip 740 is then electrically connected to a conductive pad 736 associated therewith, such as by using a wire-bonding technique.

Figure 12F:
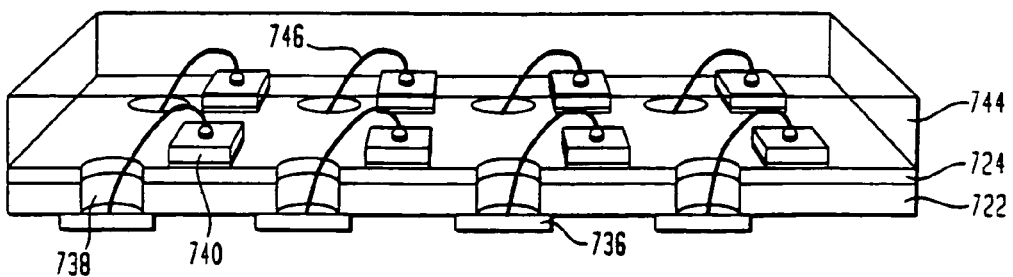

Referring to FIG. 12F, a curable liquid encapsulant 744 may then be provided over the top conductive layer 724 so as to cover the LED chips 740, the wires 746 and the openings 738 extending through the top conductive layer 724 and the dielectric layer 722. The curable encapsulant 744 is preferably at least partially transparent or translucent and is similar to the encapsulant described above. The encapsulant 744 is then cured. A transparent lid (not shown) including a lens may be applied in sheet form over the entire assembly or, as described above, may be integrally molded with the top of the package using the encapsulant and a suitable mold. The final package 710 includes a multichip module having a plurality of LED chips 740.

As these and other variations and combinations of the features described above can be utilized without departing from the present invention as defined by the claims, the foregoing description of the preferred embodiments should be taken by way of illustration rather than by way of limitation of the invention set forth in the claims.

The invention claimed is:

1. A microelectronic package comprising:
a light sensitive microelectronic element having a front face including one or more contacts and a rear surface;
conductive leads having first ends connected to said one or more contacts and second ends connected to one or more conductive pads adjacent said light sensitive microelectronic element;
an at least partially transparent encapsulant covering said light sensitive microelectronic element, said flexible leads and said one or more conductive pads, said one or more conductive pads being exposed on a surface of said encapsulant.

2. The package as claimed in claim 1, further comprising a base attached to the rear surface of said light sensitive microelectronic element, said base being exposed on a bottom surface of said encapsulant.

3. The package as claimed in claim 1, said package further comprising an at least partially transparent lid over a top surface of said encapsulant and the front surface of said light sensitive microelectronic element.

4. The package as claimed in claim 3, wherein said lid includes a material selected from the group consisting of glass, quartz, and rigid polymeric materials.

5. The package as claimed in claim 4, wherein said lid includes a lens for focusing light.

6. The package as claimed in claim 1, wherein said light sensitive microelectronic element is a light sensitive semiconductor chip.

7. The package as claimed in claim 1, wherein said light sensitive semiconductor chip includes an ultraviolet-erasable programmable read-only memory.

8. The package as claimed in claim 1, wherein said package includes two or more of said light sensitive microelectronic elements.

9. The package as claimed in claim 1, wherein said encapsulant has different levels of transparency.

10. The package as claimed in claim 1, wherein said encapsulant includes a color tinted portion.

11. The package as claimed in claim 1, wherein said encapsulant is more transparent in one portion of said package and less transparent in another portion of said package.

12. The package as claimed in claim 1, wherein said encapsulant includes a compliant material.

13. The package as claimed in claim 1, wherein the compliancy of said encapsulant varies throughout said package.

14. The package as claimed in claim 1, wherein said encapsulant adjacent said conductive pads is less compliant than said encapsulant adjacent said contacts on said light sensitive microelectronic element.

15. A microelectronic package comprising:
an electrically conductive base having a cavity formed in a top surface thereof;
a conductive pad adjacent said conductive base;
a light sensitive microelectronic element disposed in said cavity, said light sensitive microelectronic element having a front face including a first contact and a rear surface including a second contact, said second contact being electrically connected to said conductive base;
a conductive lead having a first end connected to said first contact and a second end connected to said conductive pad;
an at least partially transparent encapsulant covering said light sensitive microelectronic element, said base, said lead and said conductive pad, said conductive base and said conductive pad being exposed on a bottom surface of said encapsulant, the bottom surface of said encapsulant defining the bottom of said package.

16. A microelectronic package comprising:
a light sensitive microelectronic element having a front face including one or more contacts and a rear surface;
conductive leads having first ends connected to said one or more contacts and second ends connected to one or more conductive pads adjacent said light sensitive microelectronic element;
a transparent encapsulant covering said light sensitive microelectronic element, said flexible leads and said one or more conductive pads, said one or more conductive pads being exposed on a surface of said encapsulant.

* * * * *

UNITED STATES PATENT AND TRADEMARK OFFICE
CERTIFICATE OF CORRECTION

| | |
|---|---|
| PATENT NO. | : 7,095,054 B2 |
| APPLICATION NO. | : 10/948898 |
| DATED | : August 22, 2006 |
| INVENTOR(S) | : Joseph Fjelstad |

It is certified that error appears in the above-identified patent and that said Letters Patent is hereby corrected as shown below:

In the Claims

Column 13, line 42, insert --flexible-- before "conductive".
Column 13, line 48, insert --conductive-- before "leads".
Column 14, line 51, insert --flexible-- before "conductive".
Column 14, line 56, insert --conductive-- before "leads".

Signed and Sealed this
Thirtieth Day of September, 2014

Michelle K. Lee
*Deputy Director of the United States Patent and Trademark Office*